United States Patent
Rao

(10) Patent No.: US 8,000,140 B2
(45) Date of Patent: *Aug. 16, 2011

(54) RANDOM ACCESS MEMORY WITH CMOS-COMPATIBLE NONVOLATILE STORAGE ELEMENT

(75) Inventor: G. R. Mohan Rao, McKinney, TX (US)

(73) Assignee: S. Aqua Semiconductor, LLC, Wilmington, DE (US)

( * ) Notice: Subject to any disclaimer, the term of this patent is extended or adjusted under 35 U.S.C. 154(b) by 138 days.

This patent is subject to a terminal disclaimer.

(21) Appl. No.: 12/053,976

(22) Filed: Mar. 24, 2008

(65) Prior Publication Data

US 2009/0237997 A1 Sep. 24, 2009

(51) Int. Cl.
*G11C 11/34* (2006.01)

(52) U.S. Cl. ............ 365/185.08; 365/158; 365/185.18

(58) Field of Classification Search ............ 365/185.08, 365/158, 185.18
See application file for complete search history.

(56) References Cited

U.S. PATENT DOCUMENTS

| | | | |
|---|---|---|---|
| 4,233,672 A | 11/1980 | Suzuki et al. | |
| 4,449,205 A | 5/1984 | Hoffman | |
| 5,043,946 A | 8/1991 | Yamauchi et al. | |
| 5,757,696 A * | 5/1998 | Matsuo et al. | 365/185.07 |
| 5,835,932 A | 11/1998 | Rao | |
| 5,890,195 A | 3/1999 | Rao | |
| 5,995,409 A | 11/1999 | Holland | |
| 6,222,216 B1 | 4/2001 | Rao | |
| 6,282,118 B1 | 8/2001 | Lung et al. | |
| 6,654,284 B2 | 11/2003 | Hsu et al. | |
| 6,963,122 B1 * | 11/2005 | Soenen et al. | 257/532 |
| 6,992,928 B2 | 1/2006 | Inoue | |
| 2005/0041470 A1 | 2/2005 | Inoue | |
| 2006/0120138 A1 | 6/2006 | Liaw et al. | |
| 2007/0016720 A1 | 1/2007 | Cohen | |
| 2007/0076510 A1 * | 4/2007 | Mangan et al. | 365/230.03 |

(Continued)

FOREIGN PATENT DOCUMENTS

EP 1437742 7/2004

(Continued)

OTHER PUBLICATIONS

International Search Report and Written Opinion of the International Searching Authority, for PCT/US2009/038096, mailed Jul. 2, 2009, 15 pages.

(Continued)

*Primary Examiner* — Huan Hoang
(74) *Attorney, Agent, or Firm* — Schwabe, Williamson & Wyatt, P.C.

(57) ABSTRACT

Embodiments provide systems, methods, and apparatuses with a plurality of row lines and column lines arranged in a matrix, and at least one memory cell having an access transistor and a CMOS-compatible non-volatile storage element coupled to the access transistor in series. The CMOS-compatible non-volatile storage element includes a node and is configured to hold a charge corresponding to a n-bit binary value where n is an integer greater than 1. The access transistor has a word line gate coupled to a row line, a first node coupled to a column line, a second node coupled to a storage node, with the storage node connected to said node of the CMOS-compatible non-volatile storage element. Access circuitry coupled to the memory cell is configured to activate the memory cell and sense a resulting current corresponding to the n-bit binary value.

22 Claims, 4 Drawing Sheets

U.S. PATENT DOCUMENTS

2007/0296486 A1 12/2007 Ambroggi et al.
2009/0225584 A1  9/2009 Rao
2009/0244970 A1 10/2009 Rao

FOREIGN PATENT DOCUMENTS

WO 2009111270  9/2009
WO 2009120691 10/2009
WO 2009154833 12/2009

OTHER PUBLICATIONS

Hayashikoshi, M. et al, "A Dual-Mode Sensing Scheme of Capacitor-Coupled EEPROM Cell," IEEE Journal of Solid-State Circuits, Apr. 1992, pp. 569-573, vol. 27, No. 4.

International Search Report and Written Opinion, issued in International Patent Application No. PCT/US2009/035329, mailed Apr. 22, 2009, 11 pages.

Office Action, issued in U.S. Appl. No. 12/043,044, mailed Oct. 27, 2009.

International Search Report and Written Opinion, issued in International Patent Application No. PCT/US2009/038290, mailed Dec. 21, 2009, 12 pages.

Office Action, issued in U.S. Appl. No. 12/043,044, mailed Mar. 24, 2010.

Office Action, issued in U.S. Appl. No. 12/054,973, mailed Jun. 18, 2010.

International Preliminary Report on Patentability, issued in International Patent Application No. PCT/US2009/035329, mailed Sep. 16, 2010, 9 pages.

International Preliminary Report on Patentability, issued in International Patent Application No. PCT/US2009/038096, mailed Oct. 7, 2010, 11 pages.

International Preliminary Report on Patentability, issued in International Patent Application No. PCT/US2009/038290, mailed Oct. 7, 2010, 8 pages.

Notice of Allowance, issued in U.S. Appl. No. 12/054,973, mailed Sep. 29, 2010, 9 pages.

Office Action, issued in U.S. Appl. No. 12/043,044, mailed Aug. 30, 2010, 19 pages.

Final Office Action, issued in U.S. Appl. No. 12/043,044, mailed Mar. 29, 2011, 18 pages.

Notice of Allowance, issued in U.S. Appl. No. 12/043,044, mailed Jun. 23, 2011, 13 pages.

* cited by examiner

RANDOM ACCESS MEMORY WITH CMOS-COMPATIBLE NONVOLATILE STORAGE ELEMENT

TECHNICAL FIELD

Embodiments of the disclosure relate to the field of electronic circuits. In particular to digital memories having CMOS-Compatible Nonvolatile Storage Elements and random access memory characteristics.

BACKGROUND

Standard DRAM utilizes a capacitor to store a charge. Advantages include fast read and true random access, but the device is volatile and requires refresh to maintain the stored charge. U.S. Pat. Nos. 5,995,409 and 6,222,216 describe DRAM with some contiguous memory space dedicated to nonvolatile storage. This is accomplished by "shorting" capacitors to either "1" or "0" to provide nonvolatile—but not reprogrammable—digital memory.

Flash memory provides one type of reprogrammable non-volatile memory. Flash memory read times are slow due to limitations of the floating-gate transistor—or split-channel floating-gate transistor—that forms the basis for the flash memory cell. In standard flash, in order to properly engineer the floating-gate transistor for write and erase, the transistor regions are heavily doped. This creates a high threshold voltage (approximately 1V) relative to the power supply voltage in current art (approximately 1.8V), across the drain and source. This relatively high threshold voltage is needed to avoid "unintended disturbances" in unselected nonvolatile memory cells. When 1.5V (approximately) is applied to the control gate to select the transistor, the amount of current from source to drain is accordingly relatively low, and it therefore takes a relatively long time for the circuit to drive the bit line connected to the floating-gate transistor. Thus, the time required to sense the current—which corresponds to the stored charge—is longer than sensing times in standard DRAM, for example. This challenge is further complicated and worsened for device and circuit optimization as nonvolatile memory systems demand multilevel storage (instead of binary only).

Split-channel flash (developed in the 1980s) utilizes a split-channel floating-gate transistor to provide reprogrammable non-volatile memory, but these have numerous limitations such as requiring source-side programming and the slower read times of Flash memory.

BRIEF DESCRIPTION OF THE DRAWINGS

Embodiments will be readily understood by the following detailed description in conjunction with the accompanying drawings. Embodiments of the disclosure are illustrated by way of example and not by way of limitation in the figures of the accompanying drawings.

DETAILED DESCRIPTION OF EMBODIMENTS

Figure 1:
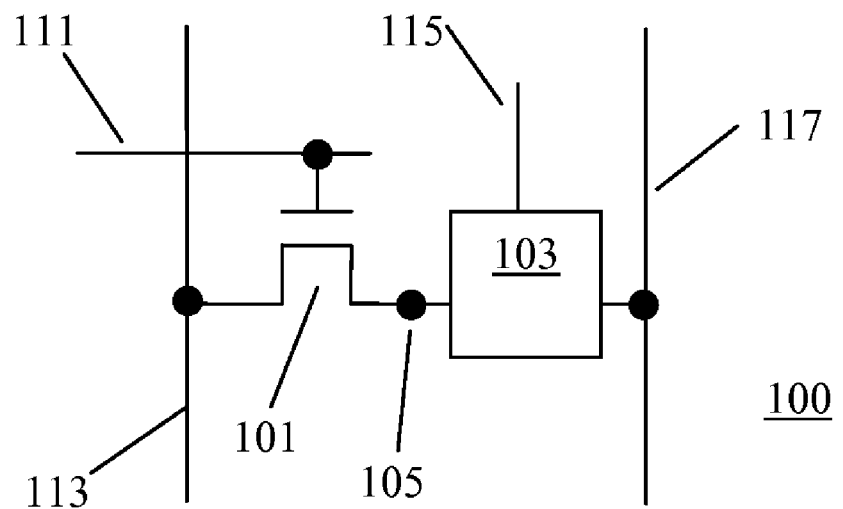
FIG. 1 illustrates a Random Access Memory cell with CMOS-Compatible Nonvolatile Storage Element in accordance with various embodiments.

In the following detailed description, reference is made to the accompanying drawings which form a part hereof, and in which are shown by way of illustration embodiments in which the disclosure may be practiced. It is to be understood that other embodiments may be utilized and structural or logical changes may be made without departing from the scope of the disclosure. Therefore, the following detailed description is not to be taken in a limiting sense, and the scope of embodiments is defined by the appended claims and their equivalents.

Various operations may be described as multiple discrete operations in turn, in a manner that may be helpful in understanding embodiments; however, the order of description should not be construed to imply that these operations are order dependent. Also, embodiments may have fewer operations than described. A description of multiple discrete operations should not be construed to imply that all operations are necessary.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

For the purposes of the description, a phrase in the form "A/B" means A or B. For the purposes of the description, a phrase in the form "A and/or B" means "(A), (B), or (A and B)". For the purposes of the description, a phrase in the form "at least one of A, B, and C" means "(A), (B), (C), (A and B), (A and C), (B and C), or (A, B and C)". For the purposes of the description, a phrase in the form "(A)B" means "(B) or (AB)" that is, A is an optional element.

The description may use the phrases "in an embodiment," or "in embodiments," which may each refer to one or more of the same or different embodiments. Furthermore, the terms "comprising," "including," "having," and the like, as used with respect to embodiments, are synonymous.

Embodiments may include memory devices and systems that have memory cells comprising an access transistor in series with a CMOS-compatible non-volatile storage element such as Magnetoresistive Random Access Memory (MRAM) cell, Phase-change memory (PCM) cell, or floating-gate transistor (e.g. a Flash memory cell). Embodiments may provide fast read on par with dynamic random access memory (DRAM) along with the non-volatility of Flash. In embodiments, stored charges may be erased one bit at a time, unlike in typical NAND Flash. Also unlike split-channel flash memory which requires source-side erase leading to potential disturbances of neighboring cells, embodiments may utilize "drain side" erasing.

In standard flash memory, in order to properly engineer the floating-gate transistor for write and erase, the transistor regions are heavily doped. This creates a high threshold voltage (approximately 1V) across the drain and source. When 1.5V is applied to the control gate of the floating-gate transistor to select the transistor (e.g. a typical word line voltage), the amount of current from source to drain is relatively low, and it takes a relatively long time to drive the bit line; thus, read times are slow. Also, because the floating-gate transistor is engineered for write operations, read times are slow not only relative to the read times in other types of memory, but also slower than the write times on the same flash memory device.

In embodiments disclosed herein with memory devices utilizing floating-gate transistors in series with access transistors, the same engineering principles may apply to doping the floating-gate transistor regions, but the amount of current that drives the bit line during sensing may be provided by the word line gate of the access transistor which may have a relatively low threshold voltage (e.g. 0.3V). Moreover, the gate of the word line can also be independently driven to a higher voltage than the control gate of a floating gate transistor. Thus, the resulting current may be higher than with standard Flash memory and read times may accordingly be quicker than with traditional flash and more in line with regular RAM. Also, in embodiments, read and write times may be similar resulting in a truer random access memory device.

In U.S. Pat. No. 5,890,195 and U.S. Pat. No. 5,835,932 a memory system is disclosed that provides a DRAM cell array and a SRAM Data latch for storing data retrieved from the DRAM array. Embodiments of the present disclosure may include an integral SRAM latch for temporarily storing data retrieved from any of the memory arrays comprising an access transistor in series with a CMOS-compatible non-volatile storage element as described throughout this disclosure for quick retrieval. These embodiments may include memory cells with floating-gate transistors. Embodiments may include multi-level storage memory cells. Furthermore, temporal and spatial caching may be employed as further described in U.S. Pat. Nos. 5,890,195 and 5,835,932. For further details, see those patent documents.

FIG. 1 illustrates a memory cell 100 with CMOS-Compatible Nonvolatile Storage Element 103 in accordance with various embodiments. Access transistor 101 may be arranged in series with CMOS-Compatible Nonvolatile Storage Element 103 with storage node 105 between them. CMOS-compatible non-volatile storage element 103 may be configured to hold a charge corresponding to a stored a n-bit binary value where n is greater than or equal to 1. In embodiments, n may be an integer greater than 1, and the n-bit binary value may be, for example, a 2-bit binary value. Access transistor 101 may have a word line gate connected to row line 111 and a first node connected to column line 113. In embodiments, storage node 105 may be connected to a second node of access transistor 101. CMOS-Compatible Nonvolatile Storage Element 103 may be connected to control line 115 and drain line 117 in embodiments. In embodiments, an array of memory cells 100 may be arranged in a plurality of rows and columns connected by a plurality of row lines 111 and column lines 113. Access circuitry may be coupled to the row lines 111, column lines 113, control lines 115, and drain lines 117 to perform access operations on the various memory cells 100 such as, for example, read, write, and erase operations. Such access circuitry may be configured to receive memory addresses and access commands and perform access operations on those memory cells 100 identified by the received addresses.

In embodiments, CMOS-compatible non-volatile storage element 103 may be a Magnetoresistive Random Access Memory (MRAM) cell, Phase-change memory (PCM) cell, or floating-gate transistor (e.g. a flash memory cell).

Figure 2:
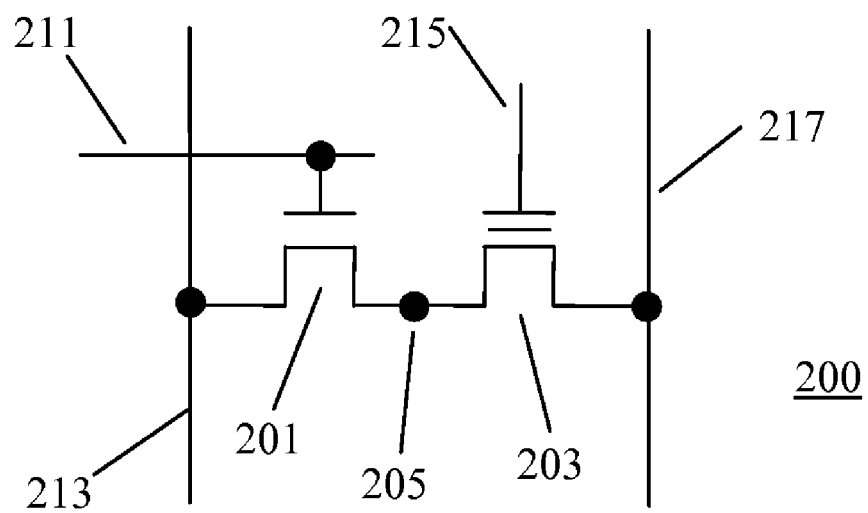
FIG. 2 illustrates a Random Access Memory cell with a floating-gate transistor storage element in accordance with various embodiments.

FIG. 2 illustrates Random Access Memory cell 200 with floating-gate transistor 203 in accordance various embodiments. Access transistor 201 may be arranged in series with floating-gate transistor 203 and with storage node 205 between them. A floating-gate of floating-gate transistor 203 may be configured to hold a charge corresponding to a stored n-bit binary value where n is an integer greater than or equal to 1. In embodiments, n may be an integer greater than 2 Access transistor 201 may have a word line gate connected to row line 211 and a first node connected to column line 213. In embodiments, storage node 205 may be connected to a source node of floating-gate transistor 203. Floating-gate transistor 203 may have a control gate connected to control line 215 and a drain node connected to drain line 217 in embodiments.

In embodiments, during a read operation, access circuitry (not shown) may be configured to set a select voltage on row line 211, select line 215, and drain line 217. During read, the access circuitry may be configured to interrogate or sense a resulting current on column line 213. In embodiments, the select voltage may be the same as a supply voltage such as for example, 3.3V, 1.5V, 1.8V, 1.0V, or other voltage. Embodiments are not limited to any particular supply or select voltages. If a negative charge has been previously stored on the floating-gate of floating-gate transistor 203, then the select voltage on select line 215—and therefore on the select gate—may be "masked" (neutralized or compensated) by the stored negative charge on the floating-gate transistor. In that case, the floating-gate transistor may not be activated, no current may flow, and no voltage may be set on storage node 205. By contrast, if no negative charge has been previously stored on the floating-gate—or if such a stored negative charge has been subsequently erased—then there will be no masking of the select voltage, current will flow through the transistor, and a voltage will be set on storage node 205. A set voltage on storage node 205 may cause current to flow from the access gate of access transistor 201 to the first node of access transistor 201. The access circuitry may be configured to sense the resulting current and, in embodiments, determine a n-bit binary value associated with the sensed current where n is an integer greater than or equal to 1.

In embodiments, a stored negative charge on the floating-gate may indicate a binary "0" and the access circuitry may be configured to associate a low level of sensed current to a binary "0". In other words, the access circuitry may be configured to associate a sensed current falling within a relatively low range of currents to a binary "0". In embodiments, such a relatively low range of currents may include zero current. The access circuitry may also be configured to associate a larger sensed current to a binary "1". In other words, the access circuitry may be configured to associate a sensed current falling within a relatively high range of currents to a binary "1". In embodiments where the stored charge on the floating-gate transistor corresponds with an n-bit binary number, where n is greater than 1, the access circuitry may be configured to sense any of $2^n$ current ranges and associate each with a different n-bit binary stored value. In such embodiments, the level of sensed current may be determined by a magnitude of the stored charge within the floating-gate transistor.

In embodiments, the floating-gate transistor may be configured to be written or programmed by either Fowler-Nordheim tunneling or hot electron injection, both of which are well-known in the art. Embodiments are not limited by any writing or programming techniques. The access circuitry (not shown) may be configured in embodiments to perform a write or program operation. In embodiments, the access circuitry may be configured to set column line 213 to 0V, row line 211 to a select voltage, and control line 215 and drain line 217 to a program voltage to write to the floating-gate. In embodiments, the program voltage may be greater than a supply voltage and the select voltage may be equal to, or nearly equal to, the supply voltage. In embodiments, the program voltage may be between 6V to 8V, or other voltage.

During an erase operation, the access circuitry (not shown) may be configured, in embodiments, to set column line 213 to ground, row line 211 to a select voltage, and drain line 217 to an erase voltage. In embodiments, the erase voltage may be greater than a supply voltage, and the select voltage may be equal to the supply voltage. This may result in a "drain-side" erase. Alternatively, the access circuitry may be configured to perform a "source-side" erase.

The above embodiments may apply to n-channel floating-gate transistors; hence the positive voltages. The same concepts may apply equally to p-channel floating-gate transistors utilizing negative voltages. Also, in embodiments, a stored charge on the floating-gate of the floating-gate transistor may correspond to a binary "0", but may correspond to a binary "1" in other embodiments.

Figure 3:
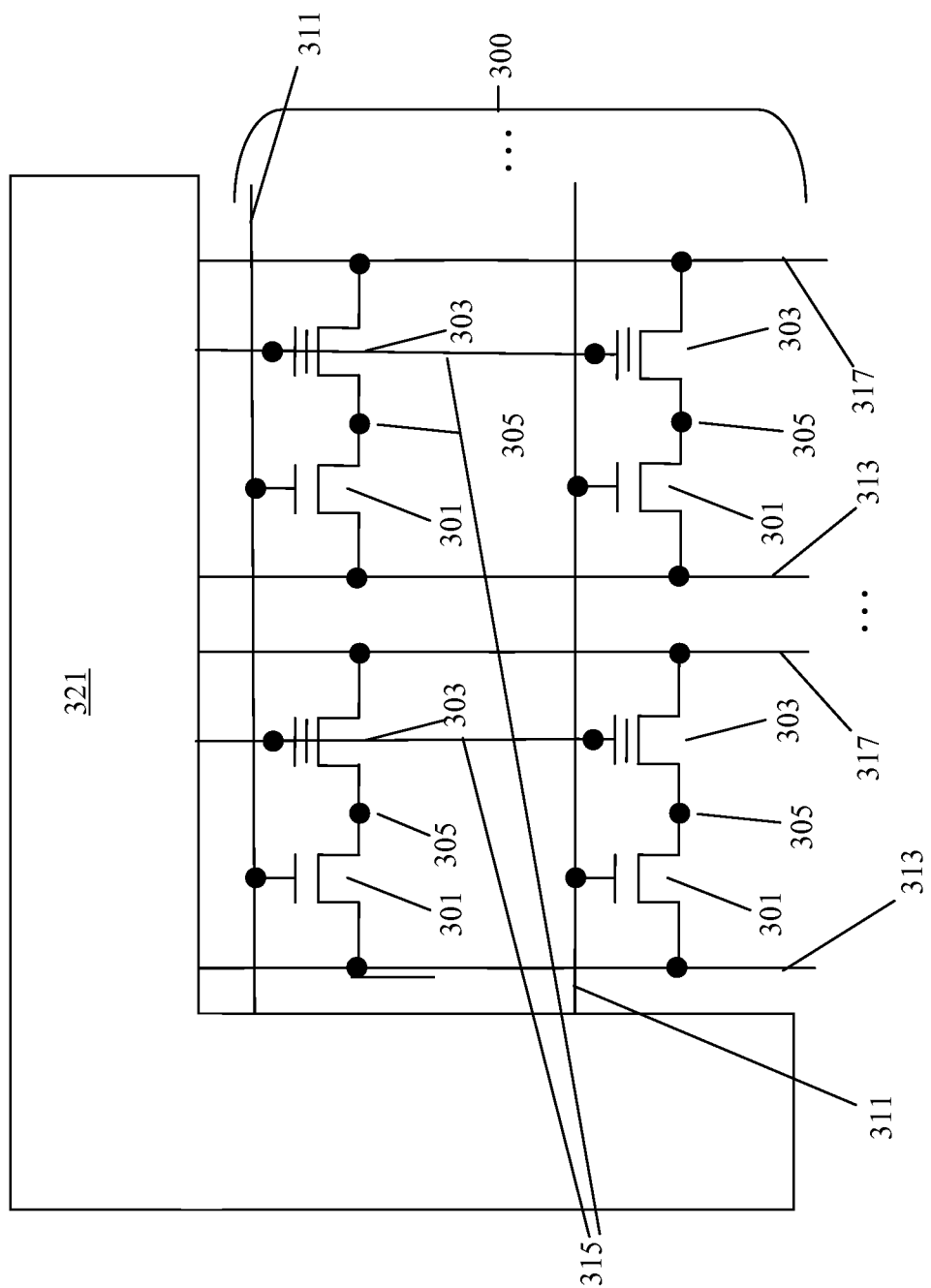
FIG. 3 illustrates Random Access Memory cell array with access circuitry and CMOS-Compatible Nonvolatile Storage Elements in accordance with various embodiments.

FIG. 3 illustrates Random Access Memory cell array 300 with access circuitry 321 and CMOS-Compatible Nonvolatile Storage Elements 303 in accordance with various embodiments. Array 300 may include a plurality of row lines 311 and a plurality of column lines 313 arranged in a matrix configuration. Although array 300 is shown with only two column lines and two row lines—including four memory cells—many more row lines, column, lines, and memory cells in various configurations may be possible in various embodiments. Embodiments are not limited to any particular array size or sizes.

Access circuitry 321 may be coupled to the plurality of row lines 311, the plurality of column lines 313, a plurality of control lines 315, and a plurality of drain lines 317. In embodiments, access circuitry 321 may be configured to set one or more of the plurality of row lines to a select voltage to select a particular row or rows of memory cells to be read, written, or erased. In a read operation, in embodiments, access circuitry 321 may be configured to set one or more control lines 315 to the select voltage, and one or more drain lines to a read voltage, and to sense a resulting current on the column lines. In embodiments, access circuitry 321 may be configured to select one or more memory cells for erasing and/or programming, as described in more detail above in relation to FIG. 2. In embodiments, access circuitry 321 may be configured to select a single word or memory cell for erase.

In embodiments, the resulting current during a read operation may comprise $2^n$ possible current ranges. In such embodiments, access circuitry 321 may be configured to sense the resulting current and determine which of $2^n$ current ranges the resulting current matches at a point in time.

Figure 4:
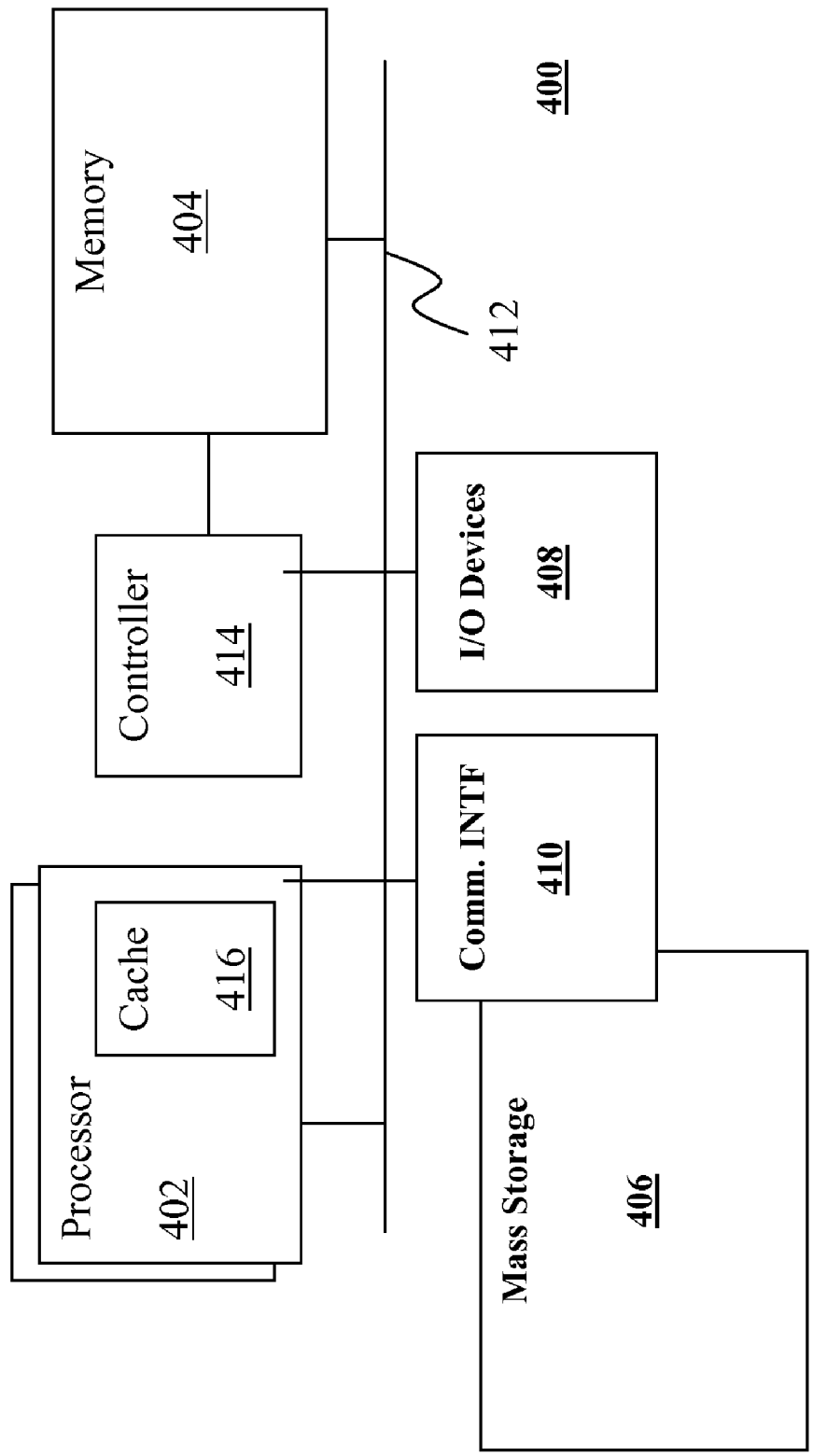
FIG. 4 illustrates a computing system including a memory device with CMOS-Compatible Nonvolatile Storage Elements in accordance with various embodiments.

FIG. 4 illustrates a computing system including a memory device with CMOS-Compatible Nonvolatile Storage Elements in accordance with various embodiments. As shown, computing system/device 400 may include one or more processors 402, and system memory 404. System memory 404 may be imbued with the teachings of one or more embodiments as described within this specification. In particular, system memory 404 may include one or more memory cells including a CMOS-Compatible Nonvolatile Storage Elements. In embodiments, such CMOS-Compatible Nonvolatile Storage Elements may be a floating-gate transistor. In embodiments, it may be a Magnetoresistive Random Access Memory (MRAM) cell or a Phase-change memory (PCM) cell.

Additionally, computing system/device 400 may include mass storage devices 406 (such as diskette, hard drive, CDROM, flash memory, and so forth), input/output devices 408 (such as keyboard, cursor control and so forth) and communication interfaces 410 (such as network interface cards, modems and so forth). The elements may be coupled to each other via system bus 412, which represents one or more buses. In the case of multiple buses, they may be bridged by one or more bus bridges (not shown). Finally, controller 414 may be included and configured to operate memory 404.

In embodiments, one or more processors 402 may include memory cache 416. Other than the teachings of the various embodiments of the present invention, each of the elements of computer system/device 400 may perform its conventional functions known in the art. In particular, system memory 404 and mass storage 406 may be employed to store a working copy and a permanent copy of programming instructions implementing one or more software applications.

Although FIG. 4 depicts a computer system, one of ordinary skill in the art will recognize that embodiments of the disclosure may be practiced using other devices that utilize RAM or other types of digital memory such as, but not limited to, mobile telephones, Personal Data Assistants (PDAs), gaming devices, high-definition television (HDTV) devices, appliances, networking devices, digital music players, laptop computers, portable electronic devices, telephones, as well as other devices known in the art.

In various embodiments, the earlier-described memory cells are embodied in an integrated-circuit. Such an integrated-circuit may be described using any one of a number of hardware-design-languages, such as but not limited to VHSIC hardware-description-language (VHDL) or Verilog. The compiled design may be stored in any one of a number of data format, such as but not limited to GDS or GDS II. The source and/or compiled design may be stored on any one of a number of medium such as but not limited to DVD.

Figure 5:
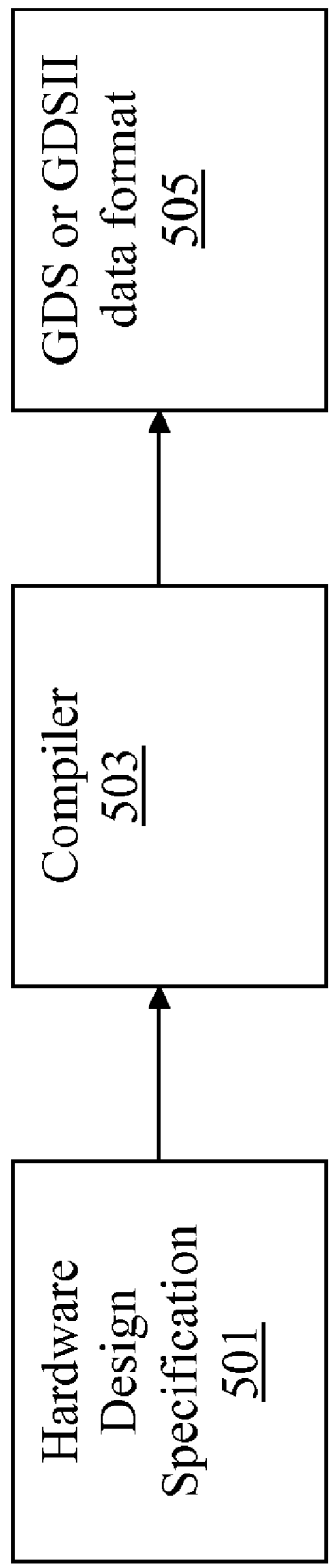
FIG. 5 shows a block diagram of a hardware design specification being compiled into GDS or GDSII data format in accordance with various embodiments.

FIG. 5 shows a block diagram depicting the compilation of a hardware design specification 501 which may be run through compiler 503 producing GDS or DGSII data format 505 describing an integrated circuit in accordance with various embodiments.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the disclosure may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:
1. A memory device, comprising:
   a plurality of row lines and a plurality of column lines;
   a memory cell comprising an access transistor and a CMOS-compatible non-volatile storage element comprising a control gate and coupled to the access transistor in series, wherein:
      the CMOS-compatible non-volatile storage element is configured to hold a charge corresponding to a n-bit binary value, wherein n is an integer;

the access transistor comprises a word line gate coupled to one of the plurality of row lines, a first node, a second node, and a storage node;

the first node is coupled to one of the plurality of column lines; and the storage node is coupled to the second node and to the CMOS-compatible non-volatile storage element; and access circuitry coupled to the plurality of row lines and to the plurality of column lines, wherein the access circuitry is configured to, as part of a read operation:

set a first select voltage on the word line gate of the access transistor;

set a second select voltage on the control gate of the CMOS-compatible non-volatile storage element, wherein the first select voltage is greater than the second select voltage; and sense a resultant current corresponding to the n-bit binary value;

wherein the access circuitry is further coupled to the control gate of the CMOS-compatible non-volatile storage element and to a drain line, and wherein the access circuitry is further configured to, as part of a write operation:

set one of the plurality of row lines to the first select voltage;

set the drain line to a programming voltage; and set the control gate to the programming voltage.

2. The memory device of claim 1, wherein the CMOS-compatible non-volatile storage element comprises a floating-gate-transistor, and wherein a source node of the floating-gate transistor is coupled to the storage node.

3. The memory device of claim 2, wherein the floating-gate transistor further comprises a drain node coupled to the drain line.

4. The memory device of claim 3, wherein the access circuitry is coupled to the control gate of the floating-gate transistor and to the drain line, and wherein the access circuitry is further configured to, as part of the read operation, set the drain line to a read voltage.

5. The memory device of claim 4, wherein the access circuitry is further configured to determine, from the resultant current, the n-bit binary value.

6. The memory device of claim 5, wherein the resultant current comprises $2^n$ possible current ranges, and wherein the access circuitry is configured to determine which of $2^n$ current ranges matches the resulting current.

7. The memory device of claim 3, wherein the access circuitry is configured to, as part of the write operation, set the control gate to the programming voltage to store a charge on the floating-gate of the floating-gate transistor.

8. The memory device of claim 3, wherein the access circuitry is further configured to, as part of an erase operation:

set one of the plurality of row lines to the first select voltage;

set the drain line to an erase voltage; and set the control gate to the erase voltage to erase a charge on the floating-gate of the floating-gate transistor.

9. An article of manufacture, comprising a non-transitory computer-readable medium including a plurality of computer-readable hardware design language instructions, or compilation of the hardware design language instructions, wherein the hardware design language instructions specify an implementation of the apparatus as set forth in claim 1 as an integrated circuit.

10. The article of manufacture of claim 9, wherein a hardware design language of the hardware design language instructions comprises either VHDL or Verilog.

11. A method of operating digital memory, the method comprising:

simultaneously setting by access circuitry of a digital memory device, as part of a read operation:

a first select voltage on a row line coupled to a word line gate of an access transistor of a memory cell of the digital memory device, the access transistor comprising a first node coupled to a column line and a second node coupled to a storage node; and a second select voltage on a control gate of a floating-gate transistor configured to hold a charge corresponding to a n-bit binary value, wherein n is an integer, wherein the floating-gate transistor is coupled to the access transistor in series, wherein the floating-gate transistor comprises a drain node coupled to a drain line and a source node coupled to the storage node, and wherein the first select voltage is greater than the second select voltage;

sensing, by the access circuitry, a resultant current on the column line resulting from said simultaneous setting; and determining, by the access circuitry, the n-bit binary value based at least on the sensed current;

wherein the access circuitry is further coupled to the control gate and to the drain line, and wherein the method further comprises, as part of a write operation:

setting, by the access circuitry, the row line to the first select voltage;

setting, by the access circuitry, the drain line to a programming voltage; and setting, by the access circuitry, the control gate to the programming voltage.

12. The method of claim 11, wherein n is equal to 1.

13. The method of claim 11, wherein the first select voltage is equal to a supply voltage of the digital memory device.

14. The method of claim 11, wherein n is an integer greater than or equal to 1 and the sensed current comprises $2^n$ possible current ranges, and wherein said determining comprises determining which of the $2^n$ possible current ranges that the sensed current matches.

15. A system, comprising:

a digital memory controller configured to issue access commands to a digital memory device; and the digital memory device, coupled to the controller, wherein the digital memory device comprises:

a plurality of row lines and a plurality of column lines;

a memory cell comprising an access transistor and a CMOS-compatible non-volatile storage element comprising a control gate and coupled to the access transistor in series, wherein:

the CMOS-compatible non-volatile storage element is configured to hold a charge corresponding to a n-bit binary value, wherein n is an integer;

the access transistor comprises a word line gate, a first node, a second node, and a storage node;

the word line gate is coupled to one of the plurality of row lines, wherein the first node is coupled to one of the plurality of column lines; and the storage node is coupled to the second node and to the CMOS-compatible non-volatile storage element; and access circuitry coupled to the memory cell, wherein the access circuitry is configured to, as part of a read operation:

set a first select voltage on the word line gate of the access transistor;

set a second select voltage on the control gate of the CMOS-compatible non-volatile storage element, wherein the first select voltage is greater than the second select voltage; and sense a resultant current corresponding to the binary value upon activation of the memory cell;

wherein the access circuitry is further coupled to the control gate of the CMOS-compatible non-volatile storage element and to a drain line, and wherein the access circuitry is further configured to, as part of a write operation:

set one of the plurality of row lines to the first select voltage;

set the drain line to a programming voltage; and set the control gate to the programming voltage.

16. The system of claim 15, wherein the CMOS-compatible non-volatile storage element comprises a floating-gate-transistor including a source node coupled to the storage node.

17. The system of claim 16, wherein the floating-gate transistor further comprises a drain node coupled to the drain line.

18. The system of claim 17, wherein:

the access circuitry is coupled to the plurality of row lines and to the plurality of column lines; and the access circuitry is configured to set, as part of the read operation, the drain line to a read voltage.

19. The system of claim 18, wherein the access circuitry is further configured to determine the n-bit binary value based at least on the sensed resultant current.

20. The system of claim 19, wherein the resultant current comprises $2^n$ possible current ranges, and wherein the access circuitry is further configured to sense the resultant current and to determine which of $2^n$ current ranges the resultant current matches.

21. The system of claim 17, wherein:

the floating-gate transistor comprises a floating-gate;

the access circuitry is coupled to the plurality of row lines and to the plurality of column lines; and the access circuitry is configured to, as part of the write operation, store a charge onto the floating-gate of the floating-gate transistor.

22. The system of claim 17, wherein:

the floating-gate transistor comprises a floating-gate;

the access circuitry is coupled to the plurality of row lines and to the plurality of column lines; and the access circuitry is configured to, as part of an erase operation, set the one of the plurality of row lines to the first select voltage, the drain line to an erase voltage, and the control gate to the erase voltage to erase a charge on the floating-gate of the floating-gate transistor.

* * * * *